(12) United States Patent
Klosterman

(10) Patent No.: US 6,208,159 B1
(45) Date of Patent: Mar. 27, 2001

(54) MACHINE PRESS MOTOR LOAD MONITOR

(75) Inventor: Dan Klosterman, Celina, OH (US)

(73) Assignee: The Minster Machine Company, Minster, OH (US)

( * ) Notice: Subject to any disclaimer, the term of this patent is extended or adjusted under 35 U.S.C. 154(b) by 0 days.

(21) Appl. No.: 09/038,403

(22) Filed: Mar. 11, 1998

(51) Int. Cl.[7] .................. G01R 31/34; G01R 19/00; H02K 23/68; H02H 9/02
(52) U.S. Cl. ............ 324/772; 324/76.11; 324/545; 361/93.1; 318/434
(58) Field of Search .................. 324/76.11, 772, 324/545; 700/34; 702/142; 318/432, 434; 361/23, 31, 88, 89, 90, 91.1, 93.1, 93.9; 100/346, 99

(56) References Cited

U.S. PATENT DOCUMENTS

| | | |
|---|---|---|
| 4,606,205 | 8/1986 | Segredo et al. . |
| 4,692,857 | 9/1987 | Chi . |
| 4,723,429 | 2/1988 | Weber et al. . |
| 4,979,401 | 12/1990 | Maeda . |
| 5,115,735 | 5/1992 | Gloe et al. . |
| 5,418,711 * | 5/1995 | Pomerleau et al. ............ 700/32 |
| 5,491,647 | 2/1996 | O'Brien et al. . |
| 5,754,450 * | 5/1998 | Solomon et al. ............ 702/35 |
| 5,949,247 * | 9/1999 | Lima et al. ............ 324/772 |

\* cited by examiner

*Primary Examiner*—Safet Metjahic
*Assistant Examiner*—Anjan K Deb
(74) *Attorney, Agent, or Firm*—Randall J. Knuth

(57) ABSTRACT

A current monitoring system for an electric motor, whereby the current is halted to the motor if the electrical load exceeds calculated electrical load limits. The system includes a current measuring device, sensors for detecting operational functions, a system for setting an electrical current limit setpoint, and a switch for halting application of electrical current to the motor. A method of halting an electrical motor if the electrical load exceeds a calculated electrical current limit is also disclosed.

35 Claims, 4 Drawing Sheets

MACHINE PRESS MOTOR LOAD MONITOR

BACKGROUND OF THE INVENTION

1. Field of the Invention

The present invention relates to an overcurrent monitoring system for use with an electrical motor and, in particular, a system for determining press operating conditions based on the electrical load on an electrical press drive motor used in a machine press.

2. Description of the Related Art

As a machine press operates, there are variations in the electrical load drawn or created by the press motor. If the current load on the motor exceeds the motor's capacity, damage and loss of use may ensue. For example, current overload may cause burnout to the motor and associated portions such as the bearings, bushings, or commutators.

Load variations may be attributed to normal press operational functions. Alternatively, load variations may not be the result of normal press functions. For effective protection, it is essential to detect normal press functions which effect electrical load.

Normal press operations that effect the electrical load include initial starting of the press drive motor, engaging the press clutch, and varying the press operating speed. Other changes which effect the electrical load include lubricating oil temperature changes and die changes.

If the electrical load increase is not attributed to normal press operations, the current increase could be an indication of a potential problem in press operation. For example, when bearings or bushings overheat, the press speed tends to slow down and there is an increase in press motor drive load. Therefore, an increase in the electrical load may indicate that press bushings or bearings are overheating. In order to safeguard the press, it is advantageous to cut power to the motor when an increase in current load is not attributed to a normal press function to permit service personnel to determine the actual cause of the increased motor load.

In the art, monitoring systems have been limited to monitoring the effective power consumption of the press motor. In addition, such motor monitoring is not constant; rather, the monitoring is limited to only a portion of the press stroke.

It is advantageous to account for variations in motor electrical current draw attributed to normal press operations. Such detection would make it possible to stop the drive motor and press before potential damage may be caused to the motor, press bearings and bushings. In turn, there is a financial benefit in preventing damage to the machine press.

The present invention prevents potential damage to a machine press motor and press when the motor electrical current draw is above predetermined limits.

SUMMARY OF THE INVENTION

According to the present invention, a system accomplishes detection of steady or transient electrical current overloads on a machine press motor. The invention measures the electrical current draw or load on the press drive motor. If the electrical current draw exceeds an acceptable load limit setpoint, i.e. a predetermined or calculated limit setpoint, the new system halts the drive press motor.

The invention determines the limit setpoint by incorporating and compensating for the current load variations associated with known operational functions. Such operational functions include, but not limited to, drive motor startup, clutch engagement, and speed change commands. When the inventional system detects one or more of these known operational functions, it may accordingly adjust the limit setpoint.

The procedure for adjusting the limit setpoint after the system detects an operational function is to add a predetermined offset to the present percent of full load current. The predetermined offset is a predetermined value which is added to the present percent of full load current to account for the electric load attributable to the detected operational function.

The invention utilizes countdown or delay timers when calculating the limit setpoints. These timers allow there to be a temporary increase in electrical load without halting current to the drive motor. When an electrical load is attributable to a detected operational function, a timer is set for a finite period of time. Consequently, the electrical current will not be halted while the timer is counting down.

The invention, in one form thereof, calculates a limit setpoint after it detects the press motor startup and activates the drive motor startup delay timer. The system then sets the limit setpoint by adding a predetermined offset to the present percent of full load current. The system continues to update the limit setpoint until the drive motor startup delay timer has expired.

The invention calculates a limit setpoint after it detects the press clutch has engaged and starts the clutch engaged startup delay timer. The system then sets the limit setpoint by adding a predetermined offset to the previous limit setpoint. The system continues to update the limit setpoint until the clutch engaged startup delay timer has expired.

The invention calculates a limit setpoint after it detects a requested large press speed change and starts the range dropout delay timer. The system creates a speed range which is calculated by taking a predetermined percentage of the requested speed and adding or subtracting the calculated percentage of speed from the requested speed.

For example, if the predetermined percentage was 15 percent and the speed request was 100 spm, the speed range would be 100 spm plus or minus 15 percent, in other words, 85 spm to 115 spm.

After the timer has expired, if the press speed is not within the requested press speed range, the system sets the limit setpoint by adding a predetermined offset to the present percent of full load current. It continues to update the limit setpoint until the press speed is within the requested press speed range.

The invention calculates a limit setpoint after it detects a small press speed change request and starts the new speed holdout delay timer. The system continuously updates the limit setpoint until the new speed holdout delay timer has expired. The system sets the limit setpoint by adding a predetermined offset to the present percent of full load current.

The invention also includes a nuisance check system that prevents halting current to the drive motor when the measured electrical load increase is short lived. The invention with this system sets a fault delay timer. While this timer is running, the invention will not halt current supplied to the drive motor. This prevents halting current supplied to the motor when the electrical load exceeds the limit setpoint for a duration shorter than the time period measured by the fault delay timer.

The invention further includes an averaging function which calculates the average electrical load over a predetermined period of time, e.g. an eight second period. If the average electrical load has dropped 2.5 percent of full load current below the previous limit setpoint, the limit setpoint is set by adding a predetermined offset to the calculated average electrical load. The purpose of the averaging function is to lower the limit setpoint as the average of the measured electrical load decreases.

For example, if the average measured electrical load is 47 and the previous limit setpoint is 50, the invention will compare 47 to 2.5 percent less than the previous set point, i.e., 47.5. Since 47 is less than 47.5, the invention will update the limit setpoint by adding a predetermined offset to the calculated average electrical load.

While the invention measures short term variations of electrical load while a machine press is operating, it can easily be adopted to measuring long term variations in electrical load. The invention could store limit setpoints for various different tool sets, die combinations, machine press conditions and tolerances.

One embodiment of the present invention is an apparatus for monitoring current draw of an electric motor. It measures the electric current draw of an electric motor and checks for operational functions. The system sets a limit setpoint and compares the limit setpoint to the measured electrical draw. The apparatus may halt current supplied to the motor on various conditions.

Another embodiment of the present invention is a process for monitoring a machine press motor supplied with electrical current comprising the following steps. Operational functions which contribute to a load on the motor are detected. The limit setpoint is set based on the detected operational functions. The electrical load on the motor or current draw is determined. The determined electrical load is then compared to the limit setpoint. Current supplied to the motor is halted if the electrical load exceeds the limit setpoint.

Yet another embodiment of the present invention is a method for monitoring a machine press motor load. A limit setpoint is calculated based on the detected operational functions effecting electrical load on the motor. The electrical load is compared to the limit setpoint. The electrical current supplied to the motor is halted if the determined electrical load exceeds the calculated limit setpoint.

A further embodiment of the present invention is an apparatus for monitoring current overload on a press drive motor. The apparatus comprises a detector for detecting electrical current draw of the motor. In addition, it includes memory means for storing the limit setpoint. It also contains a means for halting electrical current to the motor if the detected electrical current draw exceeds the limit setpoint stored in memory.

An advantage of the present invention is that the apparatus removes power from the drive motor when the identified electrical current overload is not attributed to a normal operational cause.

Another advantage of the present invention is when a current overload is detected, the apparatus halts the motor and press before potential damage is done to the motor, bearings, bushings, or the rest of the machine press.

A further advantage of the present invention is the ability to detect drive motor electrical overcurrent when the press motor is operating at less than one hundred percent capacity of its rated maximum capacity.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
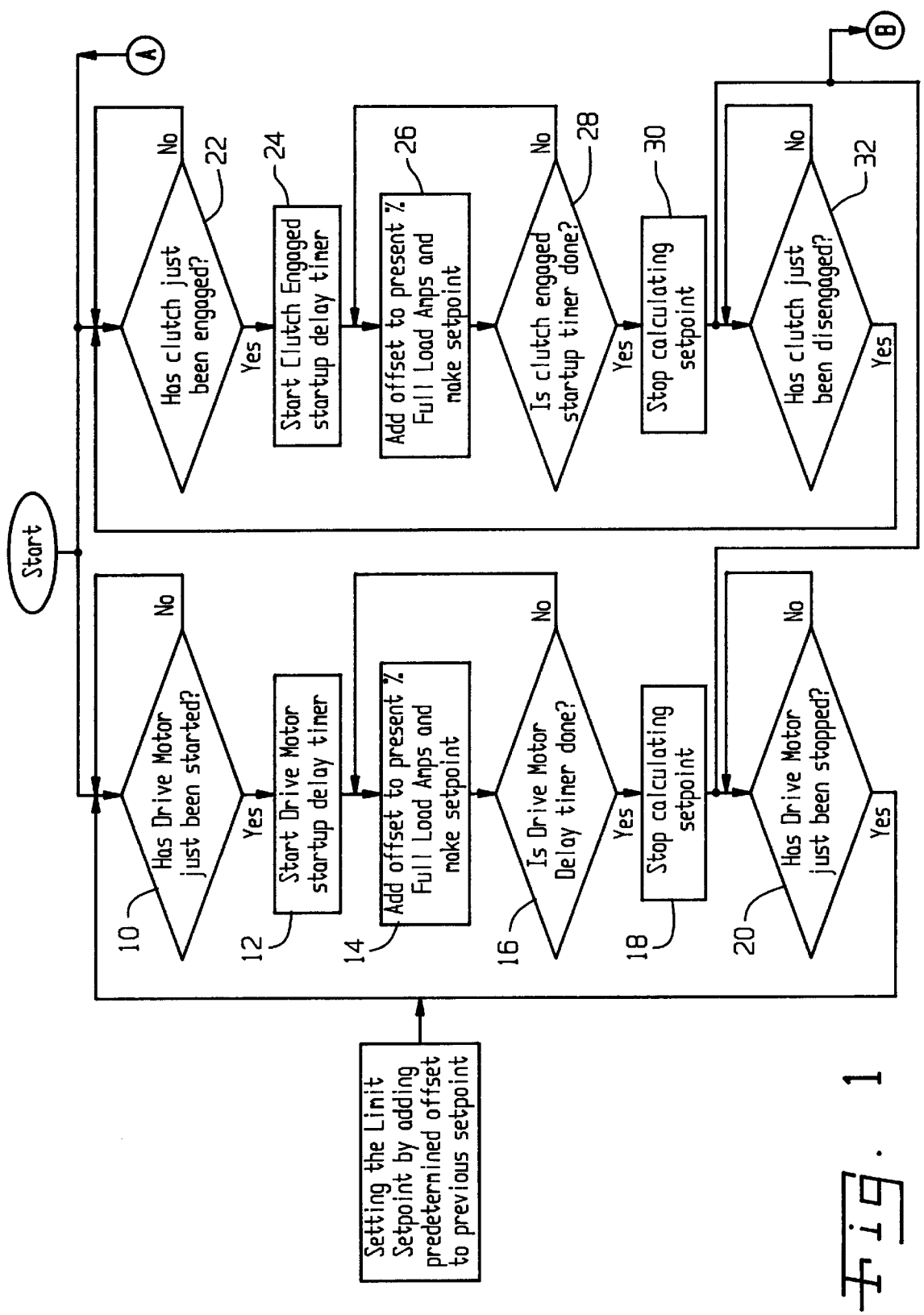
FIG. 1 is a flowchart of the program for executing the operation of an embodiment of the invention.
Figure 2:
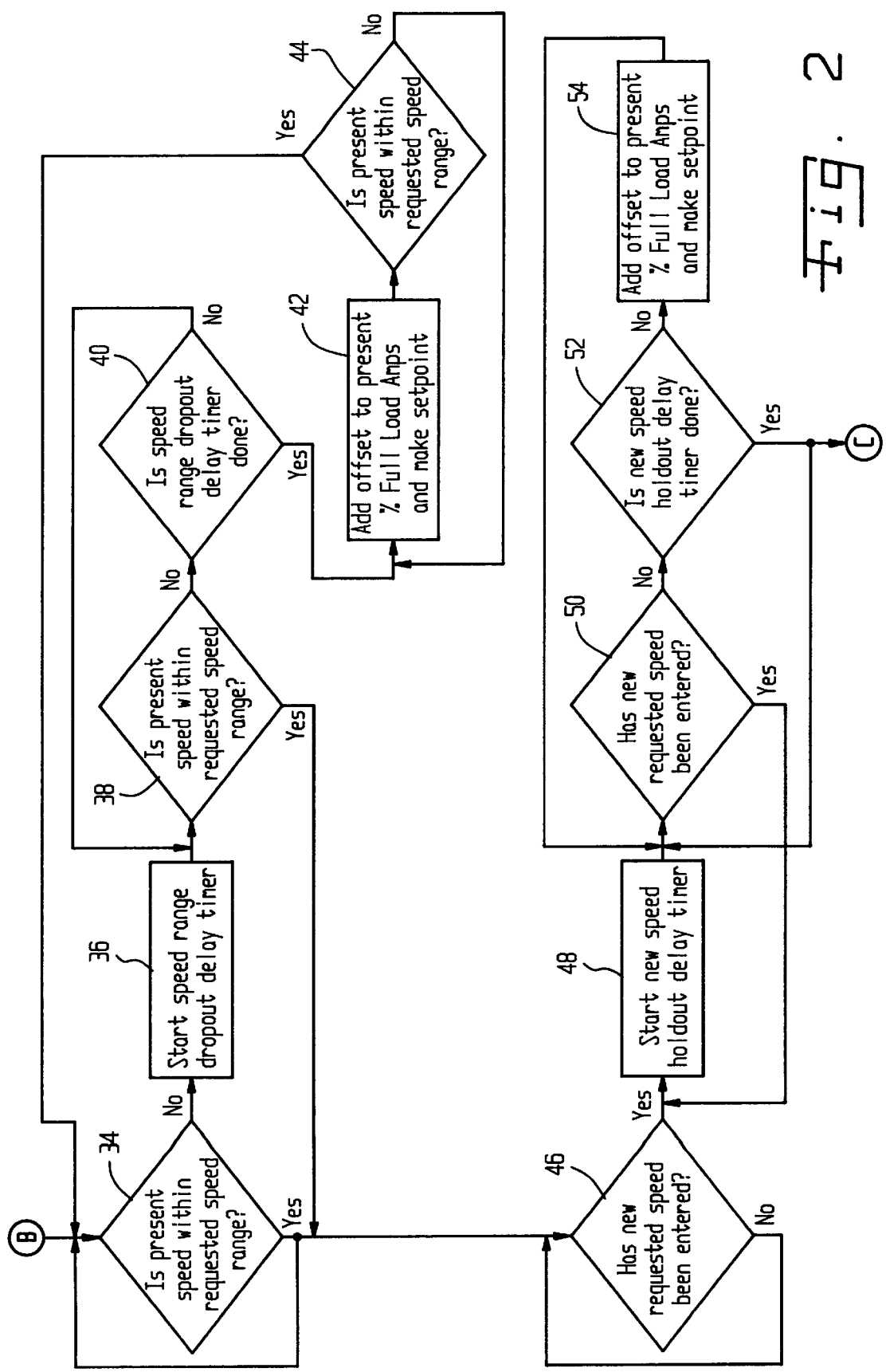
FIG. 2 is the continuation of the flowchart of the program in FIG. 1.
Figure 3:
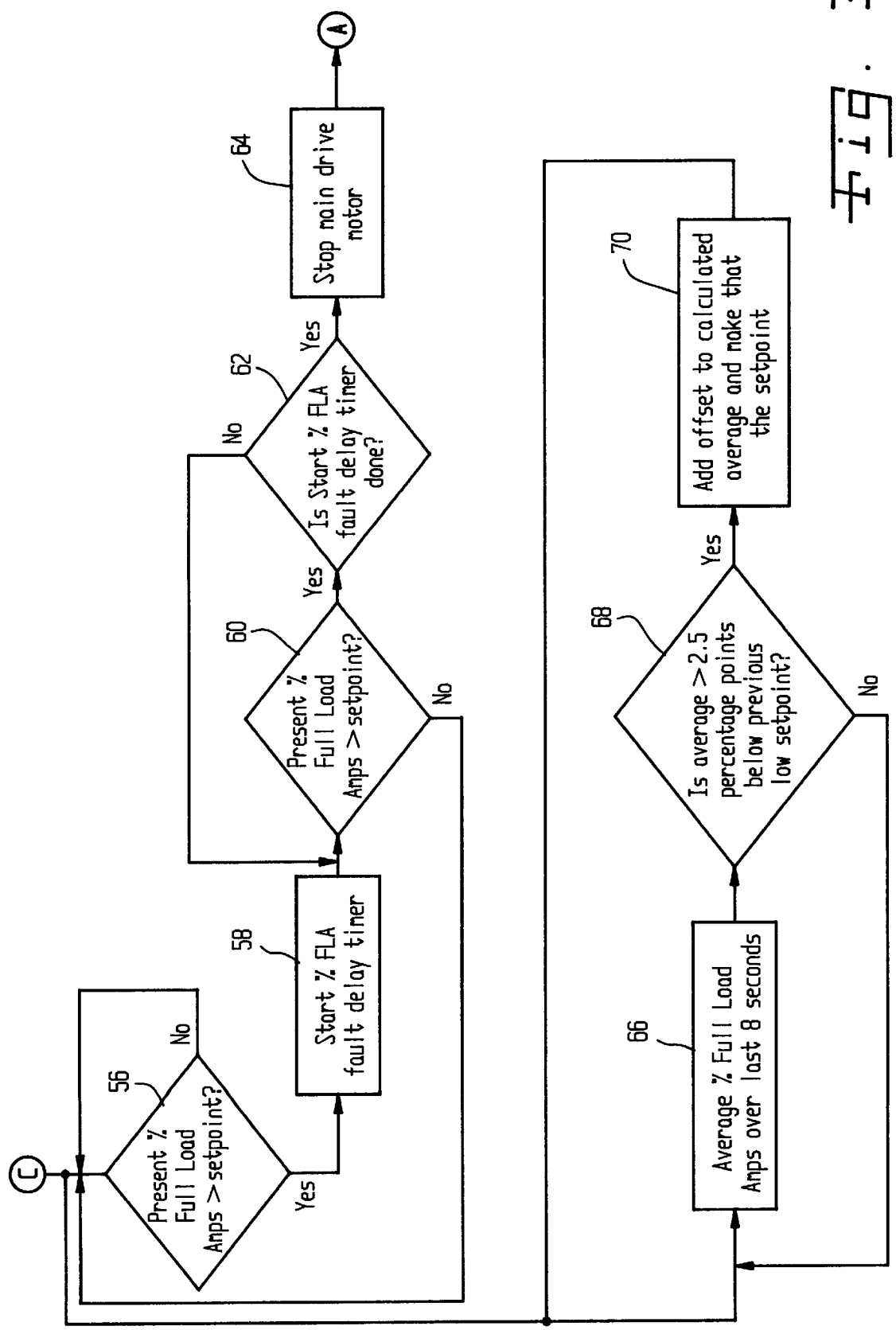
FIG. 3 is continuation of the flowchart of the program in FIG. 2.

Referring generally to FIG. 1–3, there is shown a flow chart illustrating a procedure for monitoring press motor load on a machine press according to one embodiment of the present invention. The procedure broadly involves monitoring electrical draw on a motor while accounting for operational causes of electrical current load, such as, but not limited to, motor startup, press clutch activation, and speed changes. The system sets a limit setpoint based on detected operational functions. The system then halts current to the press motor if the electrical load exceeds the limit set point.

Referring specifically to FIG. 1, the monitoring procedure begins at "start." Branches of step 10, 22, and "A" run concurrently. Steps 10–20 corresponds to a procedural branch for motor startup. Steps 22–32 refer to a procedural branch for press clutch activation. First, the system determines that the motor has been started (step 10). If the motor has been started, the system sets a drive motor startup delay timer for a period of time, preferably, twenty-five seconds (step 12). If the system has not detected drive motor startup, the procedure rechecks for motor startup (step 10).

After the drive motor delay timer has been set, a limit set point is set by adding a predetermined offset to the present percent of full load current (step 14). The system checks to see if the drive motor delay timer has expired. If the drive motor startup delay timer has not expired, the system updates the limit setpoint by adding a predetermined offset to the present percent of full load current (step 16). The predetermined offset is a predetermined value which is added to the limit setpoint to account for the electric load attributable to the detected operational function. Once the drive motor delay timer has expired, the system stops updating the limit setpoint (step 18).

The system then checks to see if the press motor has been stopped. After the drive motor delay timer has stopped, the system continuously re-checks to see if the motor has stopped (step 20). If the motor has stopped, the procedure starts from the beginning (step 10).

Steps 22–32 refer to the procedure for accounting for electrical load attributed to the press clutch engaging. The procedure determines if the clutch has recently been engaged (step 22). If the clutch has not been engaged, the system continues to recheck for clutch engagement (step 22).

If the system has determined that the clutch has recently been engaged, the system sets a clutch engagement startup delayed timer (step 24). A limit setpoint is set by adding a predetermined offset to the present percent of full load current (step 26). The system checks to see if clutch engagement start timer has expired (step 28).

If the timer has not expired, steps 26 and 28 are repeated, whereby the limit setpoint is updated by adding a predetermined offset to the present percent of full load current (step 28). When the clutch engagement startup timer has expired, the system stops recalculating the limit set point (step 30).

Finally, this procedure branch checks to see if clutch was just disengaged. If the clutch was just disengaged, the procedure repeats, starting at step 22. Alternatively, if the clutch is engaged, the system continuously rechecks to see if it has just disengaged (step 32).

Referring specifically to FIG. 2, steps 34–44 deal with large speed change requests to press speed. The system continuously checks to see if the press speed is within the speed range requested (step 34). If the press speed is not within the requested speed range, a speed range dropout timer is set (step 36). The system then checks to see if the press speed is within the speed range requested. If the press speed is within the speed range requested, the procedure starts again at step 34 to determine if present speed is within requested range.

Alternatively, if the press speed is not within requested speed range, the system checks to see whether the speed range dropout delay timer has expired (step 40). If the speed request range timer has not expired, it repeats step 38 (step 40).

If the speed range drop-out delay timer has expired, a limit setpoint is set by adding a predetermined offset to the present percent of full load current (step 42). The system rechecks to see if the press speed is within the speed range requested (step 44).

If it is not within the speed range requested, step 42 is repeated. Alternatively, if the present speed is within the speed range requested, the procedure goes back to 34 and checks to see if the speed is within the requested range (step 44).

Steps 46–54 refer to small changes to the speed of a press. First, the system determines whether a new speed has been entered (step 46). If there has not been a new speed entered, the procedure repeats step 46 to determine whether a new speed has been entered (step 46).

If a new speed has been requested, a speed holdout delay timer is set (step 48). Once again, the system checks to see if a new speed has been entered (step 50). If a new speed has been entered, step 48 is repeated. If a new request speed has not been entered, the system checks to see if the speed holdout delay timer has expired (step 52).

If the speed holdout delay timer has expired, step 50 is repeated. Alternatively, if the speed hold out delay timer has not expired, a limit setpoint is set by adding a predetermined offset to present percent of full load current (step 54). Then step 50 is repeated.

Steps 56–64 refer to a procedural branch stopping the press drive motor if the electrical draw exceeds the limit setpoint. The system first measures the electrical draw on the press motor and then compares the electrical draw to the limit setpoint (step 56). If the electrical draw does not exceed the limit setpoint, the system remeasures the electrical load and again compares the electrical load to the limit setpoint (step 56). Alternatively, if the electrical current load exceeds the setpoint, the system starts a fault delay timer (step 58). The system then measures the electrical load and compares it to the limit setpoint (step 60). If the electrical load does not exceed the setpoint, the procedure repeats step 56 (step 60). Alternatively, if the electrical load exceeds the setpoint, the system checks to determine whether the fault delay timer has expired (step 62). If the fault delay timer has not expired, step 60 is repeated. Alternatively if the fault delay timer has expired, the system halts electrical current to the press drive motor (step 64).

FIG. 3 refers to setting the limit setpoint when there is a decrease in electrical load. The procedure averages the electrical load over eight seconds (step 66) although other time averages may be equivalently used. Next, the procedure compares the average electrical load to the previous limit setpoint. If the average electrical current load has dropped 2.5 percent of full load current below the previous setpoint, the procedure repeats step 66 (step 68). Alternatively, if the average electric load has dropped 2.5 percent of full load current below the previous setpoint, the procedure sets a new limit setpoint by making the limit setpoint the calculated average from step 66 (step 70). Of course other percentage drops in average electrical load may also be utilized to cause updating of the limit setpoint.

Figure 4:
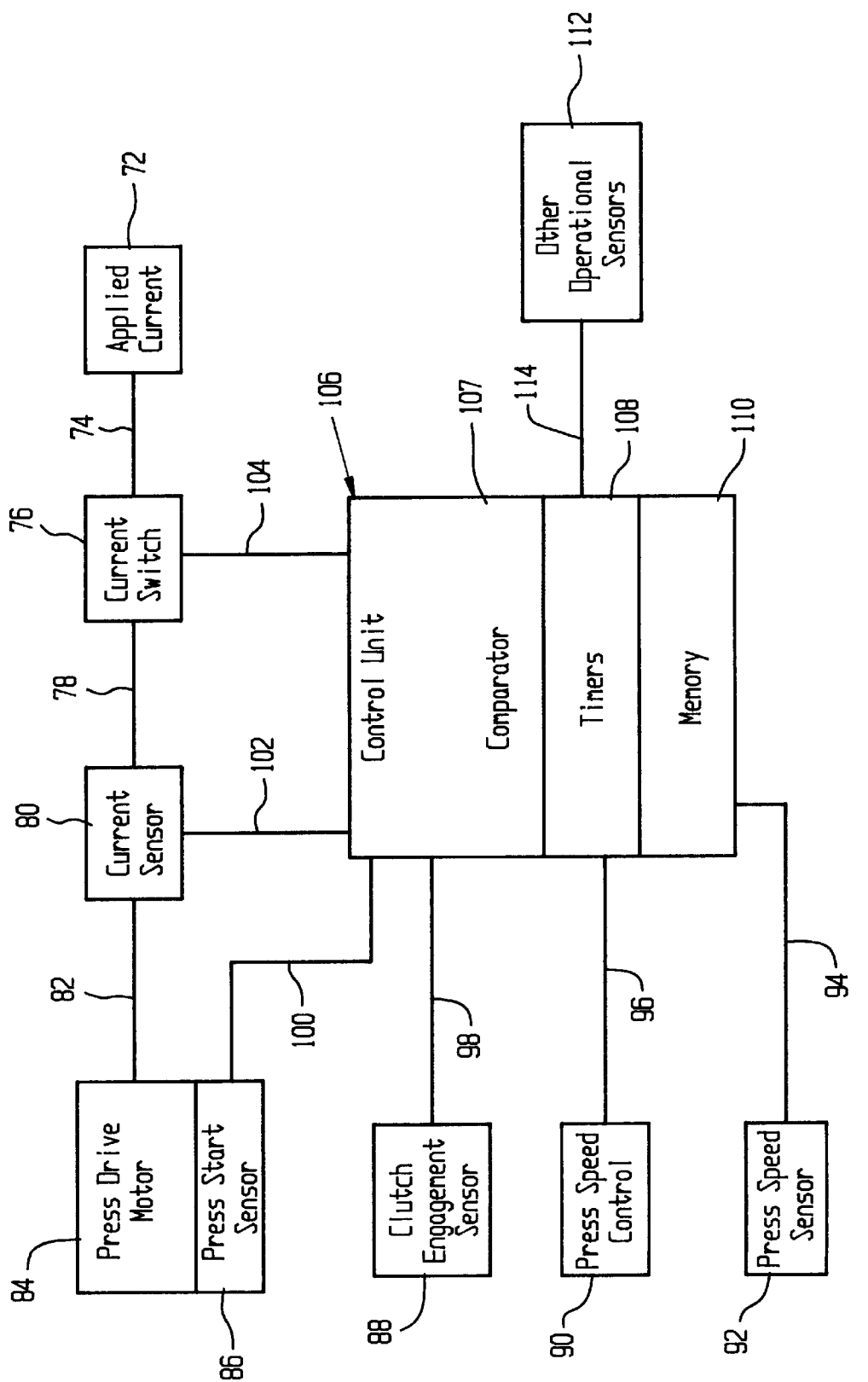
FIG. 4 is a diagram showing an example of one embodiment of the current monitoring apparatus for a machine press drive motor.

The above procedures may be implemented in a conventional PLC or microcomputer. An example apparatus is shown in FIG. 4. Referring to FIG. 4, there is shown one embodiment of a current monitoring system for a machine press drive motor. The system includes an applied current source 72 which supplies current to press drive motor 84 through a member of different devices.

Specifically, applied current 72 is connected to current switch 76 by line 74. Applied current may continue to current sensor 80 by line 78 is current switch 76 is closed. Applied current from current sensor 80 is connected to press drive motor 84 by a line 82. Current sensor 80 measures the electrical load on press motor 84.

Current switch 76 is connected to the control unit 106 by line 104. Control unit 106 sends a signal via line 104 to current switch 76 to either open or close, allowing or halting applied current 72 to press motor 84.

Press start sensor 86 detects a press motor 84 startup. The press start sensor 86 is connected to control unit 106 by line 98, whereby detection of press motor 84 startup is recorded by control unit 106.

Clutch engagement sensor 88 detects machine press clutch engagement and is connected to the control unit by line 96, whereby detection of clutch engagement is sent by a signal to control unit 106.

Press speed control 90 detects operator requested changes of press speed. Press speed control 90 is connected to the control unit 106 by line 96 whereby detection of requests changes in press speed are sent by a signal to the control unit.

Press speed sensor 92 measures the press speed and transfers the measured speed to the control unit 106 by a line 94.

Other operational sensors 112 may be connected to control unit by line 114 whereby detection signal of other operational functions are sent to the control unit 106.

Control unit 106 contains at least three separate functional units of interest here, including, comparator 107, timers 108, and Memory 110. Memory 110 in combination with the control unit microprocessor calculates and sets a limit setpoint. Comparator 107 compares the limit setpoint to the current draw measured by current sensor 80. Timers 108 are set as previously when operational sensors such as clutch engagement 88, press speed control 90, press speed sensor 92, press start sensor 86, or other operational sensors 112 detect operational functions. Timers 108 countdown from a predetermined period of time as previously discussed.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An apparatus for monitoring an electric motor in a machine environment, the apparatus comprising:
    a current detector means for measuring current draw of said electric motor;
    a operational sensor means for detecting operational functions occurring in said machine environment;
    a means for providing a limit setpoint based upon the operational function detected by said operational sensor means;
    a comparator means for comparing the limit setpoint to the measured current draw; and
    a means for controlling the operating state of said motor in accordance with the results of the comparison performed by said comparator means.

2. The apparatus of claim 1 in which said operational sensor means comprising:
    means for detecting whether the motor has been started.

3. The apparatus of claim 1 in which said operational sensor means comprising:
    means for detecting whether a clutch in said machine environment has been engaged.

4. The apparatus of claim 1 in which said operational sensor means comprising:
    means for detecting a press speed change request in relation to a press in said machine environment.

5. The apparatus of claim 1 in which said operational sensor means comprises:
    means for detecting a press speed of a press in said machine environment.

6. A method of monitoring a press machine motor supplied with electrical current, said method comprising the following steps:
    (a) detecting operational functions which contribute to an electrical load on the motor;
    (b) setting a limit setpoint based on detected operational functions;
    (c) determining the electrical load on the motor;
    (d) comparing the determined electrical load to the limit setpoint; and
    (e) deactivating the motor if the determined electrical load exceeds the limit setpoint.

7. The method of claim 6 in which said step of detecting operational functions further comprises at least one of the following steps:
    (a) determining whether the motor has been started;
    (b) determining whether a press clutch has been engaged;
    (c) determining whether the press speed is within a requested speed range; and
    (d) determining whether a press speed change has been requested.

8. A method of monitoring a motor in a press machine environment, said method comprising the following steps:
    (a) setting a limit setpoint based on press operational functions occurring in said press machine environment which affect electrical load on the motor;
    (b) determining the electrical load on the motor;
    (c) comparing said determined electrical load to the limit setpoint; and
    (d) deactivating the motor if said determined electrical load exceeds the limit setpoint.

9. The method of claim 8 in which the step of setting said limit setpoint comprises the steps of:
    (a) determining whether the motor has been started;
    (b) starting a motor startup delay timer;
    (c) setting the limit setpoint by adding a predetermined offset to the present percent of full load current;
    (d) repeating step (c) until the motor delay timer has expired.

10. The method of claim 8 in which the step of setting the limit setpoint comprises the steps of:
    (a) determining whether a press clutch has been engaged;
    (b) starting a clutch engaged startup delay timer;
    (c) setting the limit setpoint by adding a predetermined offset to the present percent of full load current; and
    (d) repeating step (c) until the clutch engaged startup delay timer has expired.

11. The method of claim 8 in which the step of setting the limit setpoint comprises the steps of:
    (a) determining that the press speed is not within a speed range;
    (b) starting a range delay timer in response to a determination that the press speed is not within the speed range;
    (c) monitoring the press speed following starting of the range delay timer, and proceeding to step (a) when the monitored press speed falls within the speed range prior to expiration of the range delay timer and proceeding to step (d) upon expiration of the range delay timer;
    (d) setting the limit setpoint by adding a predetermined offset to the present percent of full load current; and
    (e) repeating step (d) until press speed is within the speed range.

12. The method of claim 8 in which the step of setting the limit setpoint comprises the steps of:
    (a) determining that a new press speed has been requested;
    (b) starting a new speed holdout delay timer;
    (c) continuously checking that an updated new press speed has not been entered, until the new speed holdout delay timer has expired; and
    (d) setting the limit setpoint by adding a predetermined offset to the present percent of full load current, prior to expiration of said new speed holdout delay timer.

13. An apparatus for monitoring a press drive motor in a machine environment, the apparatus comprising:
    a current detector means for detecting electrical current draw of the motor;
    a first means, responsive to the occurrence of at least one operational event in said machine environment, for providing a limit setpoint based upon the occurring operational event; and
    a means for deactivating the motor if the detected electrical current draw exceeds the limit setpoint.

14. The apparatus of claim 13 in which said first means comprises:
    means for detecting whether the motor has been started; and means for adjusting the limit setpoint, such that said limit setpoint is adjusted after the motor has been started.

15. The apparatus of claim 13 in which said first means comprises:
    means for detecting whether the press clutch has been engaged; and
    means for adjusting the limit setpoint, such that the limit setpoint is adjusted after the press clutch has been engaged.

16. The apparatus of claim 13 in which said first means comprises:
    means for detecting whether a press speed is within a predetermined speed range; and
    means for adjusting the limit setpoint, such that the limit setpoint is adjusted after a new speed has been requested.

17. The apparatus of claim 1 in which said control means comprises:
    means for deactivating the motor if the measured current exceeds the limit setpoint.

18. A system for use with a drive motor in a machine environment, comprising:
    measurement means for providing a measure of the load on said drive motor;
    detection means for detecting the occurrence of at least one operating event in said machine environment;
    means for providing a limit setpoint based upon the operating event detected by said detection means; and
    means for comparing said limit setpoint with said load measurement.

19. The system as recited in claim 18, further comprises:
    means for controlling the operating state of said drive motor in accordance with the results of said comparison.

20. The system as recited in claim 18, wherein said means for providing a limit setpoint further comprises:
    a means to define an offset value for each respective one of said at least one operating event;
    a means to define a time period; and
    a means, operative at least for the duration of said time period, to iteratively update the limit setpoint by adding the respective offset value associated with the operating event detected by said detection means to an iteratively updated load measurement provided by said measurement means.

21. The system as recited in claim 20, further comprises:
    a means to deactivate said drive motor following expiration of the defined time period, in response to an indication provided by said comparison means that the most recently updated limit setpoint is exceeded by a currently provided load measurement.

22. The system as recited in claim 18, wherein the comparison operation performed by said comparison means continues iteratively with updated load measurements, until the occurrence of one of expiration of a predetermined time period and the load measurement falling below the limit setpoint.

23. The system as recited in claim 22, further comprises:
    a means to deactivate said drive motor following an indication that each load measurement used in the comparison operation during the predetermined time period exceeds the limit setpoint.

24. The system as recited in claim 18, wherein said means for providing a limit setpoint further comprises:
    adjustment means for iteratively adjusting the limit setpoint by adding a predetermined offset associated with the detected operating event to an iteratively updated load measurement provided by said measurement means.

25. The system as recited in claim 24, wherein the adjustment of the limit setpoint by said adjustment means continues for a predetermined period of time.

26. The system as recited in claim 18, wherein said machine environment includes a press machine and said at least one operating event comprises at least one of activation of said drive motor, engagement of a press clutch member, and a change in press operating speed.

27. A method for use with a drive motor in a machine environment, comprising the steps of:
    providing a measure of the load on said drive motor;
    detecting the occurrence of at least one operating event in said machine environment;
    defining a limit setpoint in accordance with the detected operating event; and
    comparing the limit setpoint with the load measurement.

28. The method as recited in claim 27, further comprises the steps of:
    deactivating said drive motor when the load measurement exceeds the limit setpoint.

29. The method as recited in claim 27, wherein the step of defining a limit setpoint further comprises the steps of:
    defining an offset value for each respective one of said at least one operating event;
    defining a time period; and
    iteratively updating the limit setpoint by adding the respective offset value associated with the detected operating event to an iteratively updated load measurement, for the duration of said time period.

30. The method as recited in claim 29, further comprises the steps of:
    deactivating said drive motor following expiration of the defined time period, in response to an indication provided by said comparison operation that the most recently updated limit setpoint is exceeded by a currently provided load measurement.

31. The method as recited in claim 27, wherein the comparison step continues iteratively with updated load measurements, until occurrence of one of expiration of a predetermined time period and the load measurement falling below the limit setpoint.

32. The method as recited in claim 31, further comprises the steps of:
    deactivating said drive motor following an indication that each load measurement used in the comparison operation during the predetermined time period exceeds the limit setpoint.

33. The method as recited in claim 27, wherein the step of defining a limit setpoint further comprises the steps of:
    iteratively adjusting the limit setpoint by adding a predetermined offset associated with the detected operating event to an iteratively updated load measurement.

34. The method as recited in claim 33, wherein the adjustment of the limit setpoint according to said adjustment step continues for a predetermined period of time.

35. The method as recited in claim 27, wherein said machine environment includes a press machine and said at least one operating event comprises at least one of activation of said drive motor, engagement of a press clutch member, and a change in press operating speed.

* * * * *